June 2, 1970 J. S. SLECHTA 3,516,000

REGENERATIVE FREQUENCY MODULATION DETECTOR WITH VOLTAGE-CONTROLLED REACTANCE CONTROLLED BY OUTPUT

Filed July 29, 1965 2 Sheets-Sheet 1

INVENTOR.
JOHN S. SLECHTA.
BY Harry M. Saragovitz, Edward J. Kelly, Herbert Berl, Julian C. Keppler
ATTORNEYS INVENTOR,
JOHN S. SLECHTA.
BY Harry M. Saragovitz, Edward J. Kelly, Herbert Berl, Julian C. Keppler
ATTORNEYS

United States Patent Office

3,516,000
Patented June 2, 1970

3,516,000

REGENERATIVE FREQUENCY MODULATION DETECTOR WITH VOLTAGE-CONTROLLED REACTANCE CONTROLLED BY OUTPUT

John S. Slechta, Plainfield, N.J., assignor to the United States of America as represented by the Secretary of the Army

Filed July 29, 1965, Ser. No. 475,900
Int. Cl. H03d *3/26, 1/04*
U.S. Cl. 329—140 1 Claim

ABSTRACT OF THE DISCLOSURE

The tank circuit of this detector includes a voltage-controlled reactance in the form of a varactor diode. The detector output is applied to the diode in such a manner that the tank circuit is automatically tuned away from the frequency of the applied frequency modulated signal. This increases the detector output for a given frequency deviation, thus providing regeneration which increases the detector gain. The amount of regeneration is controlled by a variable capacitor in series with the varactor diode.

The invention described herein may be manufactured and used by or for the Government for governmental purposes without the payment of any royalty thereon.

The present invention relates to a novel frequency modulation detector or discriminator and more particularly to a detector of the type described in which positive or regenerative feedback is utilized between the output and the tank circuit in order to modify the frequency response characteristic thereof. The regeneration is accomplished by means of a voltage-controlled reactance which forms part of the detector tank circuit. The detector output is applied to the voltage-controlled reactance in such a manner that the tank circuit is automatically tuned away from the frequency of the applied radio frequency signal. Since the output of any FM detector is proportional to the difference between the resonant frequency of its tank circuit and the applied frequency, the regeneration results in a smaller peak separation of the detector S curve and consequently a steeper slope or higher gain in the center portion thereof, while maintaining nearly normal response in the skirt regions well away from the center frequency. Such a high gain FM detector is useful in AFC loops for close control of frequency after lock-in and as a high gain demodulator for FM receivers. Further, means are provided to control the amount of regeneration applied to the voltage-controlled reactance. By this means the peak separation or frequency response can be varied.

It is therefore an object of this invention to provide a novel and useful regenerative FM detector.

Another object of this invention is to provide a high gain FM detector in which the tank circuit thereof is automatically tuned away from the applied frequency if such applied frequency differs from the center frequency.

Another object of the invention is to provide a frequency discriminator with a controllable frequency response characteristic.

A further object of the invention is to provide an FM detector with a variable amount of regeneration whereby the frequency response characteristic thereof may be adjusted by varying the amount of such regeneration.

These and other objects and advantages of the invention will be more apparent from the following detailed description and drawings, in which.

Figure 1:
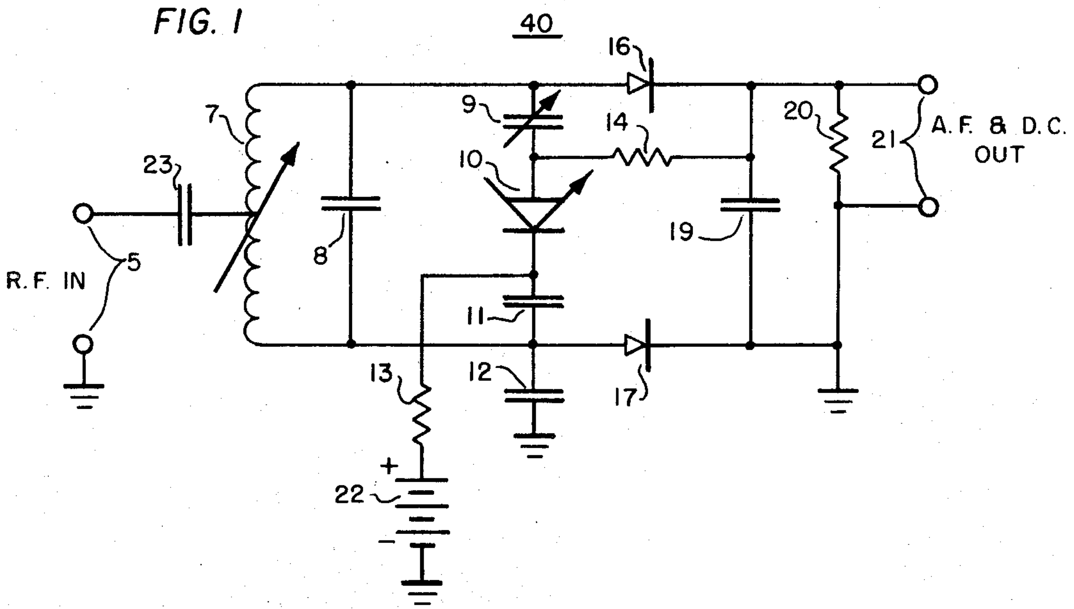
FIG. 1 is a circuit diagram of the invention as applied to a known type of FM detector.

Referring to FIG. 1, the Bond type detector shown therein includes RF input terminals 5 which are coupled via capacitor 23 to the midpoint of the tank circuit coil 7, which may be provided with slug tuning. The capacitor 8 is connected across the coil 7 and capacitor 12 is connected from the lower side of the tank circuit to ground. The RF voltages across the tank circuit and capacitor 12 are rectified by diodes 16 and 17 and applied to the output circuit comprising the RF by-pass capacitor 19, the load resistor 20, and output terminals 21. The circuit elements so far described comprise a conventional Bond type detector. In accordance with the invention, a voltage-controlled reactance in the form of a varactor diode 10 is connected to and forms part of the detector tank circuit. Adjustable capacitor 9, varactor diode 10 and blocking capacitor 11 are connected in series across coil 7 and capacitor 8. A reverse DC bias is applied to the cathode of varactor 10 via resistor 13 and bias battery 22. The output voltage of the detector is fed back to the anode of varactor 10 via isolating resistor 14. The voltage of battery 22 is made high enough so that varactor 10 is always back-biased and thus functions as a variable voltage-controlled capacitance rather than a diode. The capacitors 9 and 11 block the varactor bias from the output circuit and in addition capacitor 9 provides an adjustment of the magnitude of the regeneration, thus permitting variation of the frequency response curve of the detector.

Figure 2:
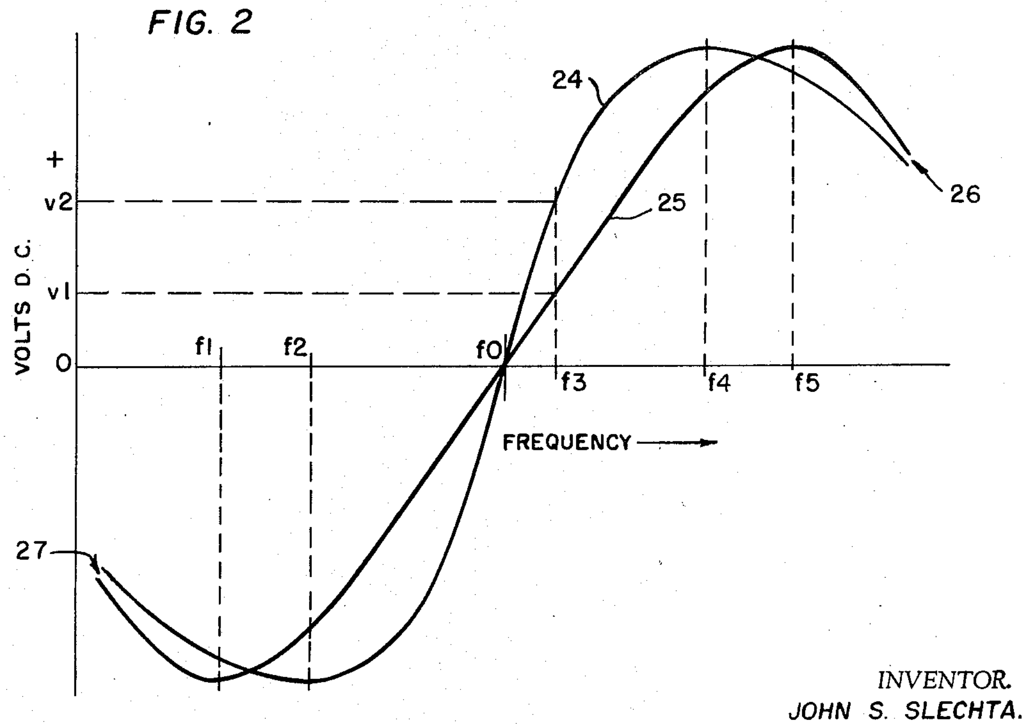
FIG. 2 shows the frequency response or S curve of FIG. 1 and also the curve which would obtain for the same detector without regeneration.

In explaining the operation of FIG. 1, it will be first assumed that the anode of varactor 10 is grounded rather than connected to the detector output as shown. In this assumed case there will be no regeneration and varactor 10 will appear as a fixed capacitor. The center frequency of the detector would then be the resonant frequency of coil 7 in parallel with an equivalent capacity formed by capacitors 8, 9, 10, and 11. The frequency response or S curve of such a detector with the anode of the varactor grounded is illustrated at 25 in FIG. 2, the center frequency being $f_0$, the lower peak at frequency $f_1$ and the upper peak at $f_5$. Curve 24 of FIG. 2 is the S curve of the circuit of FIG. 1 with the varactor anode connected to the output as illustrated. It can be seen that curve 24 has the same center frequency as curve 25, but the peaks $f_2$ and $f_4$ thereof are closer together on the frequency axis, resulting in a steeper slope or higher gain in this region. The operation of the circuit is as follows: At the center frequency the detector output is zero and there will be no voltage fed back to the varactor anode. Thus the center frequencies of the two curves of FIG. 2 are the same. Assume now that the applied input frequency at terminals 5 is increased to $f_3$. In the absence of regeneration this would produce a positive output at terminals 21 of $v_1$ volts. In the regenerative circuit of FIG. 1 this positive voltage is applied to the anode of varactor 10 via 14 and causes a reduction in the net back-bias applied thereto. This reduction in back-bias reduces the width of the depletion layer of the varactor 10, thereby raising its capacity and lowering the resonant frequency of the detector tank circuit. The tank circuit is therefore tuned in the opposite direction from the change in applied frequency. This results in an increase in output voltage to $v_2$ volts. If the applied frequency is lowered below $f_0$, a negative voltage is fed back to the varactor anode which results in a greater back-bias which raises the resonant frequency of the tank circuit, thereby producing a greater negative output.

As in any regenerative circuit, the amount of feedback must be carefully controlled to avoid instability or oscillation. This is accomplished in the present detector by limiting the amount of control of the tank resonant frequency by the varactor diode. This can be done by selecting the values of the fixed capacitor 8 relative to the capacity of varactor 10 so that the resonant frequency is determined mainly by the fixed capacitor, the varactor 10 functioning as a variable trimmer. Also, the amount of influence of the varactor on the resonant frequency can be controlled by adjusting capacitor 9. This adjustment will vary the amount of regeneration and hence vary the separation of peaks of the S curve and the slope of the curve between the peaks.

Figure 3:
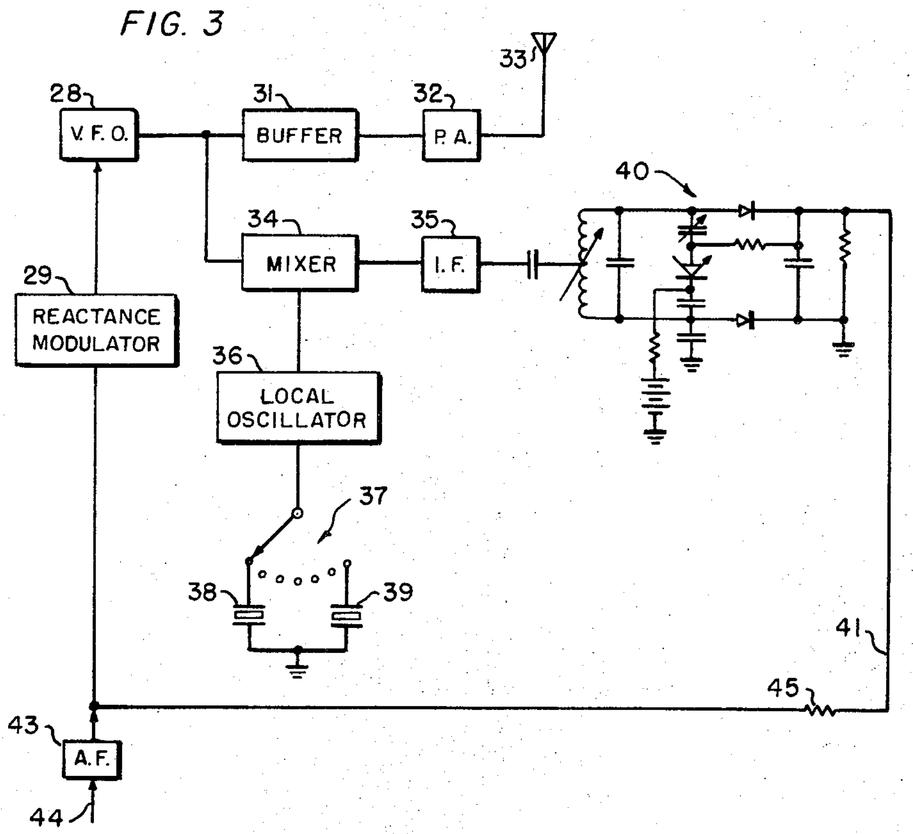
FIGS. 3 and 4 show the use of the novel detector of FIG. 1 in a radio transmitter and an FM receiver, respectively.

In FIG. 3 there is shown a block diagram of an FM transmitter utilizing the detector of FIG. 1 in the automatic frequency control (AFC) loop thereof. In this transmitter the output of variable frequency oscillator 28 is applied to buffer 31 and the mixer 34. The modulated wave is amplified in power amplifier 32 and radiated from antenna 33. The AFC system maintains the VFO 28 at a fixed frequency difference from one of a plurality of crystals 38, 39 which are selectively connected to local oscillator 36 via switch 37. The crystals determine the frequency of the local oscillator, the output of which is heterodyned in mixer 34 with the VFO output to obtain the difference frequency which is amplified by IF amplifier 35 and applied to the input of regenerative detector 40. The output of detector 40 is applied via line 41 to reactance modulator 29 which varies the frequency of VFO 28 in such a direction as to maintain the output of the mixer at the center frequency of the detector 40. The reactance modulator also frequency modulates the VFO 28 in accordance with an audio signal or other intelligence wave applied thereto through audio amplifier 43. The impedance 45 isolates the audio signal from the output of detector 40. The high gain feature of the detector 40 results in close control of the VFO frequency after a lock-in has been achieved. It can be seen from the curves of FIG. 2 that in the skirt regions 26 and 27 at either extreme of the curves, the output voltage drops off and hence the detuning effect of the varactor diode also decreases. The curves 24 and 25 thus tend to merge at frequencies well removed from the center. The result is that the pull-in range of the regenerative detector 40 is only slightly less than that of a detector without regeneration. This means that as the VFO is tuned toward the desired frequency, the detector 40 has the wide pull-in range characteristic of a low-Q detector, but once lock-in is achieved the regenerative feature yields the high sensitivity or gain characteristic of a high-Q circuit.

Figure 4:
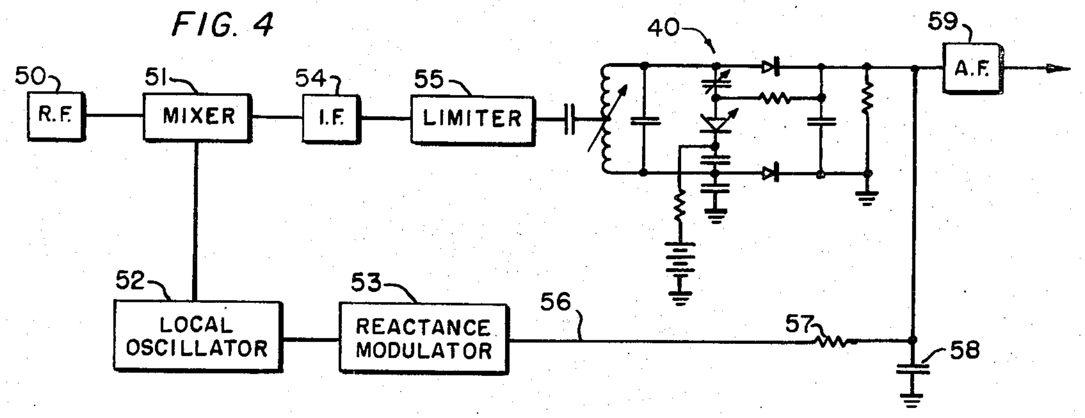

FIG. 4 shows the use of the novel regenerative detector herein disclosed in a frequency modulation receiver. The output of radio frequency amplifier 50 is heterodyned with the output of local oscillator 52 in mixer 51. The difference frequency is amplified by intermediate amplifier 54. Amplitude modulation is removed from the signal in limiter 55. The output of limiter 55 is applied to regenerative detector 40 which both demodulates the signal to recover the intelligence thereon and produces an AFC bias. The intelligence signal is applied to audio frequency amplifier 59 and thence to a utilization device (not shown). The DC component of the detector output represents the departure of the center of the intermediate frequency from the center frequency of the detector 40. This DC component is obtained by passing the detector output through a low pass filter comprising capacitor 58 and resistor 57. The filter output is fed back via line 56 to reactance modulator 53 as an AFC bias. The reactance modulator adjusts the local oscillator frequency in such a direction as to minimize the AFC bias and thus center the intermediate frequency at the center frequency of the detector 40. In addition to providing a high gain AFC loop, the regenerative feature of the detector 40 yields a higher audio frequency output for a given frequency deviation than would obtain in the absence of regeneration.

While the invention has been described in connection with an illustrative embodiment, the inventive concepts herein disclosed are of general application. For example, regeneration may be applied to other types of FM detectors such as Foster-Seeley discriminators and ratio detectors. Also, other types of voltage-controlled reactances may be used in place of the varactor diode shown, for example a saturable reactor or a reactance tube. Accordingly, the invention should be limited only by the scope of the appended claim.

What is claimed is:

1. A regenerative frequency modulation detector comprising a coil, an input terminal connected between the mid-point of said coil and ground, a first capacitor connected across said coil; an adjustable capacitor, a varactor diode and an isolating capacitor connected in series across said coil and said first capacitor, a second capacitor connected from one terminal of said coil to ground, a first diode connected from said one terminal of said coil to ground, a second diode connected between the other terminal of said coil and an output terminal, a filter capacitor and a load resistor connected in parallel between said output terminal and ground, a bias battery with its negative terminal grounded and its positive terminal connected to the cathode of said varactor diode, and a connection between said output terminal and the anode of said varactor diode.

References Cited

UNITED STATES PATENTS

| | | | |
|---|---|---|---|
| 2,231,997 | 2/1941 | Guanella | 329—140 X |
| 2,991,354 | 7/1961 | Crafts | 329—139 X |
| 2,984,794 | 5/1961 | Carter et al. | |

ALFRED L. BRODY, Primary Examiner

U.S. Cl. X.R.

307—233, 320; 329—170; 334—15